(12) United States Patent
Stoddard

(10) Patent No.: US 9,664,448 B2
(45) Date of Patent: May 30, 2017

(54) MELTING APPARATUS

(75) Inventor: Nathan Stoddard, Beaverton, OR (US)

(73) Assignee: Solar World Industries America Inc., Hillsboro, OR (US)

(*) Notice: Subject to any disclaimer, the term of this patent is extended or adjusted under 35 U.S.C. 154(b) by 803 days.

(21) Appl. No.: 13/561,456

(22) Filed: Jul. 30, 2012

(65) Prior Publication Data

US 2014/0027430 A1 Jan. 30, 2014

(51) Int. Cl.

| F27D 3/15 | (2006.01) |
| F27B 14/08 | (2006.01) |
| C01B 33/037 | (2006.01) |
| C30B 11/00 | (2006.01) |
| C30B 29/06 | (2006.01) |

(52) U.S. Cl.
CPC .......... F27D 3/1518 (2013.01); C01B 33/037 (2013.01); C30B 11/002 (2013.01); C30B 29/06 (2013.01); F27B 14/0806 (2013.01)

(58) Field of Classification Search
USPC ........................................................ 219/158
See application file for complete search history.

(56) References Cited

U.S. PATENT DOCUMENTS

| 4,203,951 A * | 5/1980 | Goriletsky ............... C30B 15/02 117/213 |
| 4,685,963 A * | 8/1987 | Saville ......................... 75/10.19 |
| 5,162,072 A * | 11/1992 | Azad ........................ C30B 15/14 117/14 |
| 5,260,037 A * | 11/1993 | Kitaura ................... C30B 15/14 117/217 |
| 5,360,599 A * | 11/1994 | Cueman ................. C30B 15/14 117/217 |
| 5,985,024 A * | 11/1999 | Balakrishna et al. .......... 117/84 |
| 6,117,230 A * | 9/2000 | Ammon .................. C30B 15/14 117/13 |
| 6,143,070 A * | 11/2000 | Bliss et al. ........................ 117/49 |
| 6,171,395 B1 * | 1/2001 | von Ammon ........... C30B 15/00 117/200 |
| 7,232,484 B2 * | 6/2007 | Cretella et al. .................. 117/19 |
| 7,418,993 B2 | 9/2008 | Frasier et al. |
| 7,655,089 B2 | 2/2010 | von Ammon |
| 8,101,019 B2 * | 1/2012 | Sahr ...................... C30B 11/003 117/11 |

(Continued)

FOREIGN PATENT DOCUMENTS

| CN | 1189546 A | 8/1998 |
| EP | 0205422 A1 * | 12/1986 ........... C30B 15/002 |

(Continued)

OTHER PUBLICATIONS

Korean Office Action of Oct. 14, 2014.

Primary Examiner — Quang D Thanh
Assistant Examiner — Renee Larose
(74) Attorney, Agent, or Firm — McGlew and Tuttle, P.C.

(57) ABSTRACT

Apparatus for the melting of silicon comprising a container for holding pieces of silicon and at least one means for heating silicon inside the container, wherein the container comprises a tube extending in a longitudinal direction for holding pieces of silicon and a bottom, wherein the tube is arranged on the bottom, wherein the bottom comprises at least one outlet for letting out melted silicon, and wherein the means for heating comprises at least one coil.

20 Claims, 1 Drawing Sheet

(56) References Cited

U.S. PATENT DOCUMENTS

| | | | |
|---|---|---|---|
| 8,317,919 B2* | 11/2012 | Bender | C30B 15/02 117/18 |
| 2004/0017838 A1* | 1/2004 | Fishman et al. | 373/138 |
| 2004/0231822 A1 | 11/2004 | Frasier et al. | |
| 2005/0279276 A1* | 12/2005 | Holder | 117/13 |
| 2006/0144089 A1* | 7/2006 | Eichholz | C03B 5/027 65/29.21 |
| 2007/0068448 A1* | 3/2007 | Shiraishi | C30B 15/14 117/13 |
| 2007/0157871 A1* | 7/2007 | Inagaki | C30B 15/14 117/50 |
| 2008/0053372 A1* | 3/2008 | Anttila | C30B 15/14 117/200 |
| 2008/0110394 A1* | 5/2008 | Noda | C30B 15/00 117/88 |
| 2009/0020257 A1* | 1/2009 | Frasier et al. | 164/122.2 |
| 2010/0037815 A1 | 2/2010 | von Ammon et al. | |
| 2010/0050932 A1* | 3/2010 | Stoddard | C30B 11/003 117/73 |
| 2010/0095883 A1 | 4/2010 | Jang et al. | |
| 2011/0185963 A1 | 8/2011 | von Ammon et al. | |
| 2011/0195251 A1* | 8/2011 | Gmeilbauer | C30B 15/14 428/401 |

FOREIGN PATENT DOCUMENTS

| | | |
|---|---|---|
| EP | 1 484 770 A1 | 12/2004 |
| GB | 968 693 A | 9/1964 |

\* cited by examiner

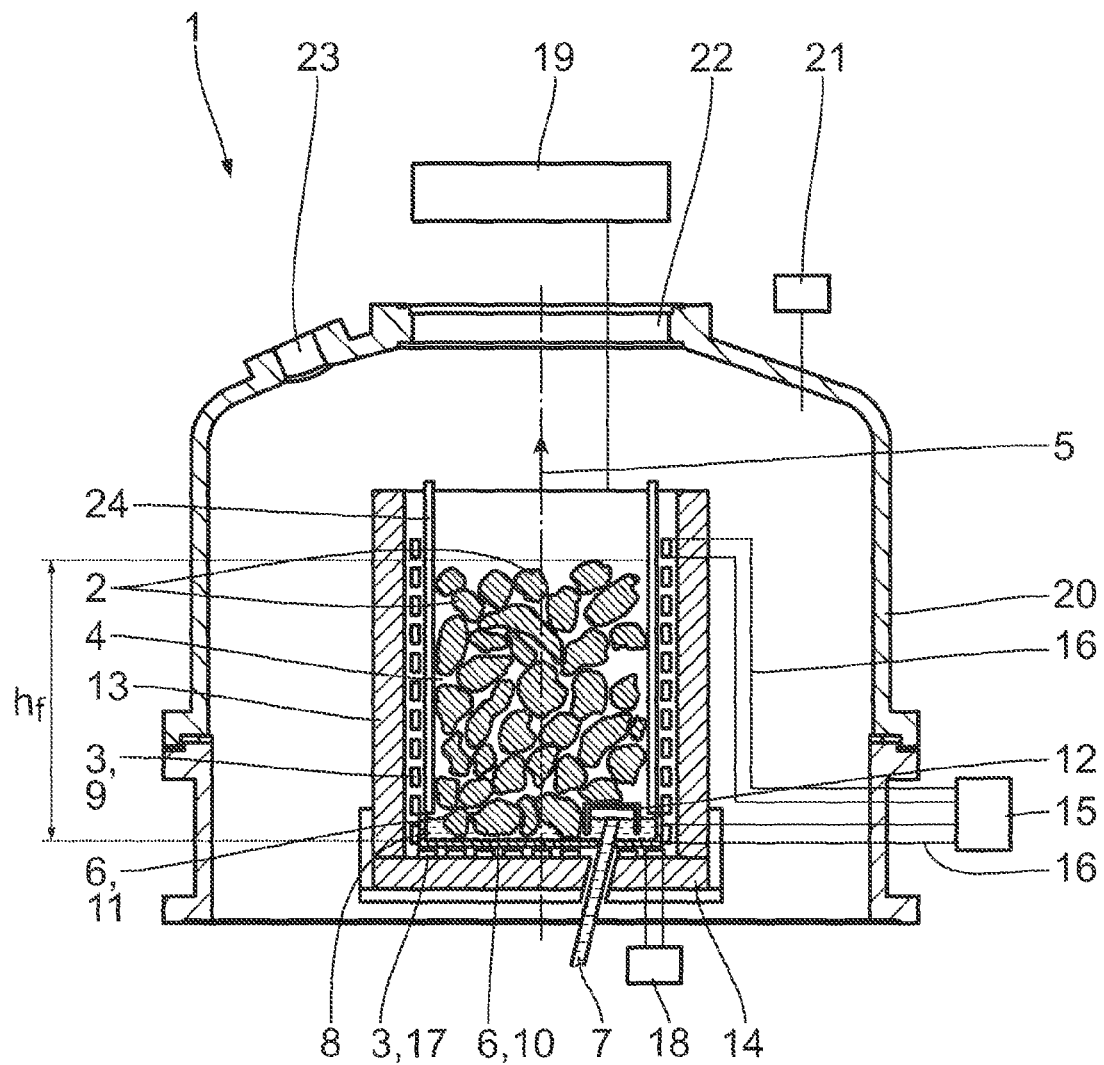

MELTING APPARATUS

FIELD OF THE INVENTION

The invention relates to an apparatus for melting of a semiconductor such as silicon. The invention further relates to a method for the melting of a semiconductor such as silicon.

BACKGROUND OF THE INVENTION

There are several semiconductor crystallization methods, in which a solid feedstock of various form factors has to be melted. For methods like Float Zone, continuous Czochralski and electromagnetic casting crystal growth, it is generally difficult to provide a high purity, closely metered stream of melted silicon, and many solutions instead choose to feed in small pieces of solid silicon. The Float Zone method can also use high cost polysilicon rods, but it is desirable to have a melting apparatus that can melt a range of feedstock without introducing impurities and deliver that melted feedstock in a closely metered flow.

Devices for melting silicon are disclosed in US 2010/0095883 A1, U.S. Pat. No. 7,655,089 B2, US 2010/0037815 A1 and US 2011/0185963 A1.

SUMMARY OF THE INVENTION

It is an objective of the invention to provide an apparatus, which facilitates the melting of a semiconductor, such as silicon.

This objective is solved by an apparatus comprising a container for holding pieces of solid feedstock and at least one means for heating the feedstock inside the container, wherein the container comprises a tube extending in a longitudinal direction for holding the pieces of feedstock and a bottom, wherein the tube is arranged above the bottom, wherein the bottom comprises at least one outlet for letting out melted feedstock by overflow, and wherein the means for heating comprises at least one coil consisting of a refractory material.

This apparatus is suitable for the melting of a number of different materials, and is particularly well suited for semiconductors where the material will have a large range of conductivity between room temperature and the melting temperature. Without limitation, we will refer specifically to silicon, but any metal or semiconductor might similarly be handled.

According to one aspect of the invention to melt pieces of a semiconductor such as silicon a means for heating is provided, which means comprises at least one heating coil, and further a container for holding pieces of silicon is provided, which container comprises a tube and a bottom, wherein the bottom of the container comprises at least one outlet.

The container, i.e. the tube and the bottom, may be made of one piece.

The bottom of the container forms a liquid holding device. It is in particular pan-shaped. According to an aspect of the invention a shallow pan can be used as the bottom. It is desirable to have a shallow melt level in the pan.

In the case of silicon, preferably at least one of the tube and the bottom is made of quartz. Preferably both, the tube and the bottom are made of quartz. They can be reinforced and/or supported by a second tube or a support plate, respectively. The support and/or reinforcement is preferably made of alumina, in particular dense, high purity alumina, or mullite, boron nitride or carbon fiber. Preferably the support tube is electrically insulating, and may have several windows.

According to another aspect of the invention the bottom comprises an overflow pan with at least one overflow spout as the outlet, which may be positioned at the side as a lip-shaped spout, or as a small wall around a central hole.

Preferably the overflow spout is arranged such that it defines an overflow level, which is located at a height in the range of between 0.5 cm and 10 cm above the base of the overflow pan. Herein the height is measured with respect to a vertical longitudinal, i.e. vertical direction of the container.

By such an arrangement of the spout a certain height of a liquid column in the container, in particular in the bottom, is maintained, and as new material is melted, the exit of the melted material is allowed to keep a constant level of melted material in the overflow pan.

According to another aspect of the invention the outlet comprises a detention element for the detention of pieces of solid silicon from the outlet. The detention element in particular comprises a weir, which is arranged above a base of the pan in a way such that a lower edge of the weir is below the overflow level defined by the outlet.

According to a further aspect of the invention the coil is made of at least one of the following materials: tungsten, molybdenum, tantalum, graphite, silicon carbide and their compounds.

The coil is preferably made of a material, which is refractory to at least the melting temperature of silicon. The material of the coil preferably has a better electrical conductivity than silicon.

In the simplest configuration, it is arranged around the tube in a single helix, although more than one independently controlled coils might be positioned at different longitudinal levels for a higher level of control.

According to an aspect of the invention the coil is connected to an alternating current (AC) power source, in particular a radio-frequency-AC power source. The frequency of the AC-power source lies in the range of 50 Hz to 4 MHz, in particular in the range of 1 kHz to 1000 kHz, in particular in the range of 5 kHz to 500 kHz, preferably above 10 kHz, preferably above 50 kHz.

Preferably the apparatus further comprises a feeding-element for a controllable feeding of solid silicon feedstock to the container. This could be a type of batch dump of a collection of chunks and chips, or it could be a vibratory feeder continuously providing small to mid size pieces of silicon.

The container is preferably arranged inside a chamber with a controllable atmosphere.

According to a further aspect of the invention the means for heating further comprises a bottom heater arranged below the pan. Such bottom heater facilitates the control of the temperature of the silicon melt and the conditioning of the exit temperature, and allows for the maintenance of a liquid state in the bottom of the crucible even if a large amount of cold material is introduced above, or the power to the primary coil is temporarily decreased.

The apparatus can further comprise an insulation element around the tube and/or an insulation element below the bottom. The insulation elements are preferably made of alumina fiber or carbon fiber. Such an insulation around the tube and/or below the bottom increases the heating efficiency of the heat device. The material is preferably both dust-free to avoid contamination, and electrically insulation to avoid parasitic coupling from the inductive heaters.

Preferably all materials between the coil and the inside of the container, in particular the feedstock, have an electrical resistivity of at least 1 Ωcm.

A further objective of the invention is to improve a method for the melting of silicon.

This objective is solved by a method comprising the following steps: providing a container for holding pieces of semiconductor feedstock, wherein the container comprises a tube and a collecting pan with an overflow spout, wherein the tube extends in a longitudinal direction, providing at least one means for heating the feedstock inside the container, wherein the means for heating comprises at least one coil, which at least partially surrounds the tube, and wherein the coil is composed of a refractory material, filling the container up to a filling height ($h_f$) in longitudinal direction with pieces of solid feedstock, applying alternating current power to the coil to heat the feedstock in the container, wherein the heating comprises inductive heating and collecting melted feedstock in the collecting pan.

The core of the invention lies in the combination of applying AC-power to the coil to heat the silicon in a container inductively and collecting the melted silicon in the collecting pan with an overflow spout. A key to the control is that the feeding rate is directly dependent in a sensitive and quickly responsive relationship to the applied coil power.

This method is suitable for the melting of a number of different materials, and is particularly well suited for semiconductors where the material will have a large range of conductivity between room temperature and the melting temperature. Without limitation, we will refer specifically to silicon, but any metal or semiconductor might similarly be handled.

The method according to the invention allows melting of silicon, wherein the melting volume is minimized, the feed rate control is maximized and the feedstock flexibility is as wide as possible. In other words, the method according to the invention allows a highly efficient melting of silicon in a highly controllable way. It enables a continuous operation with a wide range of liquid throughput.

According to another aspect of the invention a predetermined rate of melting silicon inside the container is attained by controlling the power being supplied to the coil. The rate of melting silicon inside the container is in particular controlled after an initial phase in which the silicon inside the container is heated to a temperature of at least 700° C.

The volume of liquid silicon in the container is kept constant. It is in particular automatically kept constant. The amount of liquid silicon in the container is in particular less than 10 liters, and for safety reasons can be kept as low as one tenth of a liter.

According to an aspect of the invention the power being supplied to the coil is controlled to hold the silicon in the container in a given temperature range below the melting temperature of silicon, when the predetermined rate of melting silicon is zero. The silicon in the container can in particular be held in the range of 1000° C. to 1400° C.

The AC-power applied to the coil preferably has a frequency in the range of 50 Hz to 4 MHz, in particular in the range of 1 kHz to 1000 kHz, in particular in the range of 5 kHz to 500 kHz.

According to a further aspect of the invention the filling height of the pieces of silicon feedstock in the container is monitored. This facilitates a continuous operation. In particular, more silicon can be fed into the container as soon as the filling height falls below a predetermined level.

Furthermore, the filling height is adjusted to be almost as high as an uppermost section of the coil. By this it can be insured that all the silicon feedstock in the container is localized in a volume, where it can be efficiently heated by the coil.

Preferably during melting of the silicon the filing height of the silicon in the container is adjusted, such that it does not fall below a predetermined level in longitudinal direction. The predetermined level can be at a height of 10% of the tube height measured from the liquid level, in particular the overflow level. In particular according to an aspect of the invention more silicon is introduced into the tube by a feeding element, in particular from the top, once the filling height of the solid feedstock inside the tube falls below a predetermined minimum level, in particular of 10% of the tube height measured from the overflow level. This can be repeated to prolong the operation for as long as the liquid feed is needed. It is advantageous to add more solid silicon while there is still a volume of un-melted pieces of silicon that can cushion the landing of the new feedstock and prevent fracture of the holding container, and also prevent any flash-freezing of liquid.

According to a further aspect of the invention the temperature of the melted silicon in the collection pan is controlled by controlling the power being supplied to a bottom heater, such that it can be maintained in a liquid state independent of the control of the upper heater or the addition of cold feedstock.

Furthermore it is possible to maintain the solid feedstock inside the container and/or the liquid silicon in the collection pan at a predetermined temperature. In particular, it is possible to maintain the silicon feedstock at a temperature below the melting temperature of silicon, preferably in the range of 1000° C. to 1400° C. Similarly, the liquid silicon in the collection pan can be frozen and maintained at a temperature below the melting temperature of silicon, in particular at a temperature in the range of 1000° C. to 1400° C. By this, the melting can easily be paused and/or stopped and restarted quickly on demand. To resume the melting method the power supplied to the coil is termed up again.

An important element of the method is the freedom to melt a wide range of feedstock material, from polysilicon rods to large chunks to small chips to granulated silicon. On the large end, a polysilicon rod can be suspended from one end and slowly lowered into the melting crucible. The melting silicon will drip off the end and fall down into the melt pan. Alternately, large chunks and/or small to medium chips can be dumped into the tube, landing on top of the previously placed, not-yet-melted silicon pieces. On the far end, flowable feedstock like small chips or granulated spheres could be fed in to the tube continuously or semi-continuously. One frequent difficulty in melting distributions of silicon chunks is an effect known as bridging, where silicon chunks high up in the melting vessel will partially melt and bind together across the span of the vessel. As the lower material is melted (typically due to bottom or side positioning of heaters), a bridge of silicon pieces is left suspended above. At the point when the edges of the bridge finally melt, the bulk of the suspended mass will fall down, potentially causing damage to the crucible and splashing of the liquid causing degradation of the hot zone. In this method, bridging can be effectively avoided by limiting the height of filling of the tube. For example, bridging can certainly be avoided if the fill level does not exceed the level at 66% of the height of the coil.

In each case, the action of the melting acts in a similar way. When the feedstock is relatively cold, high purity silicon is generally non-conductive and will not couple to the radio frequency magnetic field being generated by the coil. Without a load in the coil, the refractory material will heat up and start heating the feedstock and insulation through radiation. As the silicon heats, its conductivity increases like any semiconductor. Once it reaches a certain critical temperature, it will start to react to the magnetic field. At this point, an electrical circuit will be established in the feedstock around the perimeter and the material will start to be heated inductively. As more heat is transferred directly into the feedstock, the temperature of the heating coil will actually decrease. The induction efficiency (power induced as current in the silicon divided by total power) will remain high as long as the refractory coil conductivity is higher than the conductivity of the solid at the melting temperature, but the overall heating efficiency can remain high whether the induction is efficient or not as long as the loads are well matched and the surrounding insulation is effective. The coupling circuit in the silicon will automatically adjust downwards as melting of the feedstock continues and the fill level lowers. When new feedstock is introduced, the coupling circuit will readjust upwards as the new feedstock is heated by the existing feedstock and the coil.

A key aspect of the method is the direct control of flow rate by the coil power. Because the melter works by overflow from the pan, the flow rate out of the pan will be determined by the flow rate of newly melted silicon coming down from the feedstock in the coil. Because the power of the coil is directly coupled to heat the silicon, and not into a susceptor or a reradiator, the time response of the melt rate to changes in the coil heater power is very short. Flow control is typically difficult with highly reactive materials like molten silicon. Mechanical methods for flow control are typically difficult within a vacuum chamber, so this method that relies only on power control is advantageous. Monitoring for the rate of outflow can be accomplished through a load cell positioned under the melter, and the coil power can be placed in feedback with the load cell output data.

The control of impurities is another key function of this method. In this case, the only contact material to the silicon is high purity silica. The containment tube and melt pan can be composed of either quartz or fused silica. Preferably the lower end of the tube is configured to drip into the pan and is positioned above the melt line. The dissolution of quartz in silicon is a slow process, introducing primarily oxygen as an impurity, along with a very low concentration of transition metals. The constant movement of silicon through the melting zone prevents the accumulation of oxygen or impurities in the melt volume, restricting the oxygen concentration in the liquid to below $5 \times 10^{17}$ atoms/cm$^3$ in the ideal case. Similarly, total metal levels can be kept below $1 \times 10^{13}$ atoms/cm$^3$ in the ideal configuration.

Doping of the feedstock is crucial for making useful crystals. According to embodiments of this invention, the melting method includes the addition of dopants such as, in the case of silicon feedstock, boron, phosphorus, antimony, arsenic, gallium, aluminum and indium. These may be added in one of several methods. First, small pieces of highly doped silicon can be distributed among the feedstock chunks being added to the melting tube. These pieces will melt at approximately the same rate as the rest of the silicon, and homogenization of the doping concentration will occur in the shallow melt volume in the pan. Second, a small, dedicated tube may be introduced that allows the direct introduction of doped material into the melt. Small pieces of highly doped silicon or pure dopant materials such as aluminum or gallium can be metered in to the dedicated tube at a separately controlled rate. Third, a doping gas can be used, optionally introduced directly into the vicinity of the shallow melt. For example, a gas consisting of 99% argon and 1% phosphene or 1% diborane might be used.

Further details and advantages of the invention follow from the description of an embodiment of the invention by means of the drawing.

BRIEF DESCRIPTION OF THE DRAWING

FIG. 1 shows an exemplary cross-section through an embodiment of an apparatus for melting of silicon.

DESCRIPTION OF THE PREFERRED EMBODIMENT

An apparatus 1 for the melting of silicon comprises a container for holding pieces of silicon 2 and at least one means 3 for heating silicon inside the container.

The container comprises a tube 4 extending in a longitudinal direction 5 for holding the pieces of silicon 2 and a bottom 6, wherein the tube 4 is arranged on the bottom 6.

The tube 4 may have a round, in particular a circular cross section. Without restriction the cross-section could be square or rectangular, but preferably has rounded corners. Whatever the shape of the tube, it is optimal for the cross-section of the heating means 3 to closely match that of the tube. The tube 4 has a side wall 24. The side wall 24 has a thickness in the range of 2 mm to 2 cm, in particular in the range of 5 mm to 6 mm.

The tube 4 has a diameter in the range of 10 cm to 50 cm, in particular in the range of 25 cm to 35 cm. It has a height in longitudinal direction 5 of at least 20 cm, preferably of at least 40 cm. The height of the tube 4 in longitudinal direction 5 is in particular in the range of 20 cm to 80 cm, in particular in the range of 30 cm to 60 cm. Other dimensions of the tube 4 are similarly possible.

The tube 4 is preferably cylindrical or conical. The longitudinal orientation of the tube 5 is preferably vertical, but could be configured in an offvertical direction The bottom 6 comprises an outlet 7 for letting out melted silicon 8. The outlet 7 may be configured as a spout protruding outwards from the side wall or it may be internal to the pan cross section, for example a hole in the floor 10 separated from the rest of the floor by an enclosing wall protruding from the floor.

The means for heating 3 comprises at least one coil 9.

The bottom 6 forms a liquid holding device. The bottom 6 is preferably pan-shaped. It comprises a base 10 and rim 11. The bottom 6 preferably comprises an overflow pan with at least one overflow spout as the outlet 7. The overflow spout is preferably lip-shaped if a side outlet, or if it is configured as an interior hole, the enclosing wall preferably has a v-notch to guide the effluent liquid. In either case, the bottom level of the lip or the v-notch will define the fill level of the bottom 6.

The overflow spout is arranged at a height in a range of between 0.5 cm and 10 cm with respect to the longitudinal direction 5 above the base 10 of the pan. Thus, it defines an overflow level. The overflow level is in particular between 1 cm and 10 cm from the bottom-most point of the container.

Furthermore, the outlet 7 comprises a weir to prevent a passing of any small solid of silicon 2 through the outlet 7. More generally, the outlet 7 comprises a detention element 12 for the detention of pieces of solid silicon 2 from the outlet 7. The detention element 12 is arranged such that it excludes solid pieces of silicon 2 floating on the melted silicon 8 from exiting the container. In particular, the detention element 12 has a lower edge, which is arranged below the overflow level. The lower edge of the detention element 12 preferably has one or more notches to allow the flow of liquid underneath the notch and into the center of the element. The maximum height of the notch is preferably located below the melt level of the pan in order to prevent the passing of floating material such as solid silicon or floating inclusions. Furthermore, the outlet 7 may comprise an exit tube or sluice to deliver the melted feedstock into a separate process, for example to crystallize the silicon in a controlled manner.

Alternatively, a filter element can be used as the detention element 12.

The tube 4 is made of quartz, silica, silicon nitride ($Si_3N_4$), silicon carbide (SiC) or any mixture or combination thereof. The bottom 6 is made of quartz, silica, silicon nitride ($Si_3N_4$), silicon carbide (SiC) or any mixture or combination thereof.

The tube 4 and coil 9 are surrounded by an insulation element 13. The insulation element 13 is made of alumina fiber or carbon fiber.

The bottom 6 is placed on a support 14. The support 14 can be built as insulation element. It can be made of alumina fiber or carbon fiber. Because quartz tends to soften at high temperatures, the tube 4 and/or the bottom 6 can be reinforced and/or supported by a second tube or a support plate, respectively (not pictured). The reinforcement is preferably made of alumina, mullite or carbon fiber.

The coil 9 wraps around the tube 4 in a single helix. It is made of a refractory material, in particular a material refractory to at least the melting temperature of silicon. The coil 9 is preferably made of at least of one of the following materials: tungsten, molybdenum, tantalum, graphite, silicon carbide and their compounds. The coil 9 can also be made of a composite of two or more of these materials. It is able to withstand method temperatures with, at most, gas cooling. The coil 9 is preferably made of a material with a better electrical conductivity than silicon at its melting point.

Preferably none of the materials between the coil 9 and the pieces of silicon 2 to be melted have an electrical resistivity less than 1 Ωcm.

The coil 9 is connected to an AC-power source 15.

The coil 9 is connected to the AC-power source 15 by connection leads 16. The connection leads 16 can be made of the same material as the coil 9.

The AC-power source 15 is adapted to provide electrical power with a frequency in the range of 50 Hz to 5 MHz, in particular in the range of 1 kHz to 1000 kHz, in particular in the range of 50 kHz to 500 kHz. Most preferably it is a radio-frequency AC-power source.

The means for heating 3 further comprises a bottom heater 17. The bottom heater 17 is arranged below the pan. The bottom heater 17 can be built as inductive heater. It is also connected to an AC-power source 18. For details of the AC-power source reference is made to the description of the AC-power source 15. It is also possible to connect both the coil 9 and the bottom heater 17 to one and the same AC-power source.

The apparatus 1 further comprises a feeding element 19. The feeding element 19 is only shown schematically in FIG. 1. It is arranged above the container. It is controllable to control the amount of silicon feedstock, in particular, pieces of silicon 2 fed into the container. The pieces of silicon 2 fed into the container have a size in the range of stones, gravel, sand or silt. They have a sieve size of up to 20 cm. Alternately, large and contiguous rods of polysilicon may be suspended from above and slowly lowered into the melting zone.

The apparatus 1 further comprises a chamber 20, in which the container is placed. The chamber 20 can be sealed gas tight. It can in particular be evacuated or filled with a purge gas by a gas exchange element 21.

The chamber 20 has a passage way 22 for recharging the container with silicon feedstock 2. The chamber 20 further comprises a view port 23. The view port 23 enables the visual monitoring of the melting of the pieces of silicon 2.

In the following the operating principle of the apparatus 1 is described. Silicon feedstock, that is the pieces of silicon 2 are fed into the tube 4 by the feeding element 19. The tube 4 is filled up to a filling height $h_f$ in longitudinal direction 5 with the pieces of silicon 2. The filling height $h_f$ is controlled so as not to exceed the topmost level of the heating coil 9 around the tube 4. To avoid bridging, an even lower height limit for $h_f$ may be established.

To heat the silicon inside the container power is applied to coil 9 surrounding the tube 4. In particular AC-power is applied to the coil 9. Thus, the heating comprises inductive heating. The frequency of the AC-power applied to the coil 9 is in the range of 50 Hz to 4 MHz, in particular in the range of 1 kHz to 1000 kHz, most preferably in the range of 50 kHz to 500 kHz. In particular radio frequency power is applied to the coil 9. At the beginning of the method, the pieces of silicon 2 are heated radiatively by the coil. However, when the temperature of the pieces of silicon 2 inside the tube 4 exceed a certain temperature, in particular when the temperature of the silicon inside the tube 4 exceeds 700° C., the silicon becomes conductive enough to suspect to the magnetic field. Then it heats primarily by induction.

Once the temperature of the silicon in the tube 4 exceeds the melting temperature of silicon, it starts to drip down to the bottom 6 where it accumulates as melted silicon 8. It accumulates in the bottom 6 of the container and flows under the detention element 12 until it reaches the overflow level. Once it reaches the overflow level, the rate of melted silicon 8 exiting the apparatus 1, in particular exiting through the outlet 7, is controlled by the supply of power to the heating coil 9.

Once the filling height $h_f$ of the pieces of silicon 2 inside the container gets to within 10% of the height of the tube 4 measured from the level of melted silicon 8, in particular measured from the overflow level, more silicon, in particular, more solid pieces of silicon 2, is introduced into the tube 4 from the top by the feeding element 19. The new pieces of silicon 2 fall onto the existing pieces of silicon 2 inside the tube 4 and fill up the tube 4 to some higher filling height $h_f$. This filling up the tube 4 can be repeated to prolong the operation for as long as a feed of melted silicon 8 is needed.

If necessary, the melted silicon 8 can be frozen and maintained at a high temperature, in particular at a temperature in the range of in between 1000° C. and 1400° C., while a downstream method is paused and/or stopped and restarted. The melting of the silicon inside the container can be resumed by turning back up the power on demand.

In the following further aspects of the method are described summarily.

The rate of melting the silicon inside the container is controlled by the power being supplied to the coil 9. In particular, a predetermined rate of melted silicon inside the container is attained by controlling the power being supplied to the coil 9.

After an initial phase the amount of melted silicon 8 in the container is kept constant. It is in particular kept in the range of up to 10 liters.

When the predetermined rate of melting silicon is set to zero the power being supplied to the coil 9 can be controlled to hold the pieces of silicon 2 in the container in a given temperature range at or below the melting temperature of silicon. The temperature of the silicon inside the container can in particular be held in the range of between 1000° C. and 1410° C. This can easily be done by adjusting the power supplied to the coil 9 and/or the bottom heater 17.

Similarly, the state of the melted silicon 8 in the bottom 6 of the container and/or the temperature of the melted silicon 8 exiting to the outlet 7 can be controlled and adjusted by the power supply to the bottom heater 17.

Preferably, the filling height $h_f$ of the solid silicon inside the container is monitored throughout the melting method. The filling height $h_f$ is preferably adjusted to be at most a height of an uppermost section of the coil 9 in longitudinal direction 5. During melting of the silicon the filling height $h_f$ of the pieces of silicon 2 inside the container is adjusted, such that it does not fall below a predetermined level in longitudinal direction 5. It can be adjusted, such that it does not fall below a height of 10% of the height of the tube 4, measured from the overflow level. Once the filling height $h_f$ falls below such a predetermined level more solid pieces of silicon 2 are added to the container by the feeding element 19. This recharging of the container with solid pieces of silicon 2 can be performed automatically. The recharging can be done as a batch process (as described above), or could be managed through a more steady introduction of feedstock over time, for example by a vibratory feeder.

The method according to the invention can be performed continuously for as long as melted silicon 8 is needed.

The use of the coil 9 as an inductive heating element facilitates the control of the heating, since the inductive heating is much more precisely controllable than radiative heating, with a minimum of stored heat in the heaters, insulation or supporting parts to slow down the reaction time of the system.

What is claimed is:

1. An apparatus for the melting of semiconductor feedstock, the apparatus comprising:
    a container for holding pieces of solid feedstock; and
    at least one heating means for heating the feedstock inside the container, wherein the container comprises a tube extending in a longitudinal direction for holding the pieces of feedstock and a bottom comprising an overflow pan, wherein the tube is arranged above the bottom, wherein the bottom comprises at least one outlet for letting out melted feedstock by overflow, wherein the heating means for heating comprises at least one coil consisting of a refractory material, said heating means further comprising a bottom heater arranged below the overflow pan, wherein said coil and the bottom heater are connected to an AC power source, respectively, wherein a predetermined rate of melting feedstock is attained by controlling power supplied to the coil, wherein a temperature of melted feedstock in the overflow pan is controlled by controlling power supplied to the bottom heater such that the melted feedstock in the overflow pan is maintained in a liquid state independent of control of the coil.

2. An apparatus according to claim 1, wherein the overflow pan comprises at least one overflow spout as the outlet, wherein the overflow spout is arranged such that the overflow spout defines an overflow level, which is located at a height in a range of between 0.5 cm and 10 cm with respect to the longitudinal direction above a base of the overflow pan such that a level of melted feedstock in the overflow pan is constant.

3. An apparatus according to claim 1, wherein the at least one outlet comprises a detention element for the detention of pieces of solid feedstock from the outlet.

4. An apparatus according to claim 3, wherein the detention element comprises a weir which is arranged above a base of the overflow pan in a way, such that with respect to the longitudinal direction a lower edge of the weir is below the overflow level.

5. An apparatus according to claim 1, wherein the coil is made of at least one of the following materials: tungsten, molybdenum, tantalum, graphite, silicon carbide and their compounds, wherein the coil is controlled independent of the bottom heater.

6. An apparatus according to claim 1, wherein the semiconductor feedstock is silicon.

7. An apparatus according to claim 1, wherein a load cell is positioned at a level beneath the melt pan to measure the outflow of melted feedstock.

8. An apparatus according to claim 1, wherein a separate tube is provided for the direct introduction of a doping material into the melted volume.

9. An apparatus according to claim 1, wherein a temperature of said container is controlled exclusively by said alternating current power source, said bottom heater and said coil, wherein at least said alternating power source connected to said coil is controlled such that a volume of liquid feedstock inside the container is kept constant.

10. An apparatus according to claim 1, wherein said bottom heater is connected to a bottom heater alternating current power source, said coil being connected to a coil alternating current power source, wherein a temperature of said container is controlled exclusively by said bottom heater alternating current power source, said coil alternating current power source, said bottom heater and said coil.

11. An apparatus according to claim 1, wherein said AC power source connected to said coil is a radio-frequency AC power source.

12. An apparatus according to claim 11, wherein the frequency of the AC power source lies in a range of above 10 khz.

13. An apparatus according to claim 1, wherein the coil and the bottom heater are inductive heaters.

14. An apparatus according to claim 1, wherein the apparatus allows a continuous operation of melting feedstock.

15. An apparatus according to claim 1, wherein a volume of liquid feedstock inside the container is kept constant.

16. An apparatus according to claim 15, wherein a volume of liquid feedstock in the container is less than 10 liters.

17. An apparatus for melting semiconductor feedstock, the apparatus comprising:
    a container for holding pieces of solid feedstock, said container comprising a bottom portion and a tube extending in a longitudinal direction for holding the pieces of feedstock, said bottom portion comprising an overflow pan, said tube being arranged above said bottom portion, said bottom portion comprising at least one discharge outlet for melted feedstock, wherein melted feedstock passes from an interior of said container to a position located outside of said interior of said container via said discharge outlet;

a refractory material coil comprising one or more of tungsten, molybdenum, tantalum, graphite and silicon carbide, at least a portion of said coil being located adjacent to said tube;

a bottom heater located adjacent to said bottom portion;

one or more alternating current power sources, said bottom heater and said coil being connected to said one or more alternating current power sources, wherein said bottom heater is controlled independently of said coil.

18. An apparatus according to claim 17, wherein a predetermined rate of melting feedstock is attained by controlling power supplied to said coil and a temperature of the melted feedstock in the overflow pan is controlled by controlling power supplied to the bottom heater such that the melted feedstock in the overflow pan is maintained in a liquid state independent of control of the refractory material coil.

19. An apparatus for melting semiconductor feedstock, the apparatus comprising:

a container for holding pieces of solid feedstock, said container comprising overflow pan and a tube extending in a longitudinal direction for holding the pieces of feedstock, at least a portion of said overflow pan defining a bottom portion of said container, said tube being arranged above said bottom portion, said overflow pan comprising at least one outlet structure, said outlet structure being in communication with an interior of said container, wherein said outlet structure defines at least a portion of a flow path for delivering melted feedstock from a position in said interior of said container to a position outside of said interior of said container;

a refractory material coil comprising one or more of tungsten, molybdenum, tantalum, graphite and silicon carbide, at least a portion of said coil being located adjacent to said tube;

a bottom heater located adjacent to said overflow pan;

one or more alternating current power sources, said bottom heater and said coil being connected to said one or more alternating current power sources, wherein power is controlled to one or more of said bottom heater and said refractory material coil such that a constant level of liquid feedstock is maintained inside the container, wherein the refractory material coil and the bottom heater are independently controlled.

20. An apparatus according to claim 19, wherein a predetermined rate of melting feedstock is attained by controlling the power supplied to said coil and a temperature of the melted feedstock in the overflow pan is controlled by controlling the power supplied to the bottom heater such that the melted feedstock in the overflow pan is maintained in a liquid state independent of control of the refractory material coil.

* * * * *